US 11,217,724 B2

(12) United States Patent
Park et al.

(10) Patent No.: US 11,217,724 B2
(45) Date of Patent: Jan. 4, 2022

(54) LIGHT-EMITTING SEMICONDUCTOR DEVICE HAVING FLAT PORTION AND CONCAVE-CONVEX PORTION FOR ENHANCED LIGHT EXTRACTION EFFICIENCY

(71) Applicant: SUZHOU LEKIN SEMICONDUCTOR CO., LTD., Taicang (CN)

(72) Inventors: Duk Hyun Park, Seoul (KR); Byung Hak Jeong, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 208 days.

(21) Appl. No.: 16/497,755

(22) PCT Filed: Jun. 7, 2018

(86) PCT No.: PCT/KR2018/006484
§ 371 (c)(1),
(2) Date: Sep. 25, 2019

(87) PCT Pub. No.: WO2018/226049
PCT Pub. Date: Dec. 13, 2018

(65) Prior Publication Data
US 2020/0035859 A1    Jan. 30, 2020

(30) Foreign Application Priority Data
Jun. 7, 2017   (KR) ........................ 10-2017-0070764

(51) Int. Cl.
*H01L 33/14*   (2010.01)
*H01L 33/22*   (2010.01)
(Continued)

(52) U.S. Cl.
CPC .............. *H01L 33/14* (2013.01); *H01L 33/22* (2013.01); *H01L 33/38* (2013.01); *H01L 33/62* (2013.01)

(58) Field of Classification Search
CPC ......... H01L 33/14; H01L 33/22; H01L 33/38; H01L 33/62
See application file for complete search history.

(56) References Cited

U.S. PATENT DOCUMENTS

| 2002/0195609 A1 | 12/2002 | Yoshitake et al. |
| 2014/0166975 A1* | 6/2014 | Ito ........................ H01L 33/38 257/13 |

(Continued)

FOREIGN PATENT DOCUMENTS

| JP | 2003-174191 A | 6/2003 |
| JP | 2014-120695 A | 6/2014 |

(Continued)

*Primary Examiner* — Matthew E. Gordon
(74) *Attorney, Agent, or Firm* — Birch, Stewart, Kolasch & Birch, LLP

(57) ABSTRACT

A semiconductor device according to the present invention comprises: a conductive substrate; a semiconductor structure disposed on the conductive substrate and comprising a first conductive-type semiconductor layer, a second conductive-type semiconductor layer, and an active layer disposed between the first conductive-type semiconductor layer and the second conductive-type semiconductor layer; and a first electrode disposed on the semiconductor structure and electrically connected to the first conductive-type semiconductor layer, wherein the semiconductor structure further comprises a 1-1 conductive-type semiconductor layer between the first conductive-type semiconductor layer and the first electrode; and the top surface of the semiconductor structure comprises a flat part, on which the first electrode is disposed, and a concave-convex part surrounding the flat part, wherein a second distance, which is from the bottom surface of the (Continued)

semiconductor structure to the bottom surface of the concave-convex part contacting a side surface of the flat part, may be between 70% or more and 95% or less with respect to a first distance, which is from the bottom surface of the semiconductor structure to the top surface of the 1-1 conductive-type semiconductor layer. The present invention may enhance light flux by improving the current spreading phenomenon of the semiconductor device.

20 Claims, 10 Drawing Sheets

(51) Int. Cl.
*H01L 33/38* (2010.01)
*H01L 33/62* (2010.01)

(56) References Cited

U.S. PATENT DOCUMENTS

| 2014/0209958 | A1 | | 7/2014 | Park et al. |
| 2017/0358706 | A1 | | 12/2017 | Kim et al. |
| 2019/0056070 | A1 | * | 2/2019 | Kim ................... H01L 33/0033 |
| 2019/0148591 | A1 | * | 5/2019 | Huang ................ H01L 33/0095 257/101 |

FOREIGN PATENT DOCUMENTS

| KR | 10-2014-0097898 | A | | 8/2014 |
| KR | 10-2014-0099619 | A | | 8/2014 |
| KR | 20140099619 | A | * | 8/2014 |
| KR | 10-2016-0076785 | A | | 7/2016 |
| KR | 10-2016-0145413 | A | | 12/2016 |

* cited by examiner

[Fig. 1]
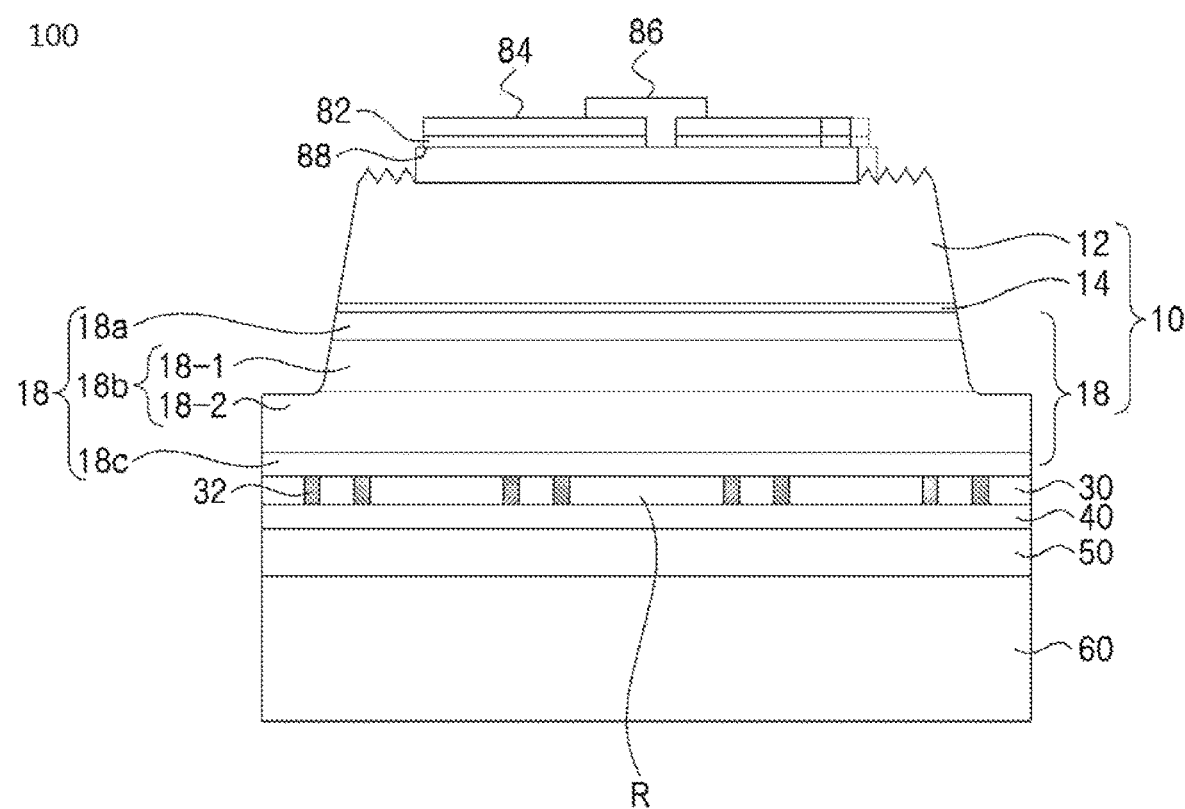

[Fig. 2]
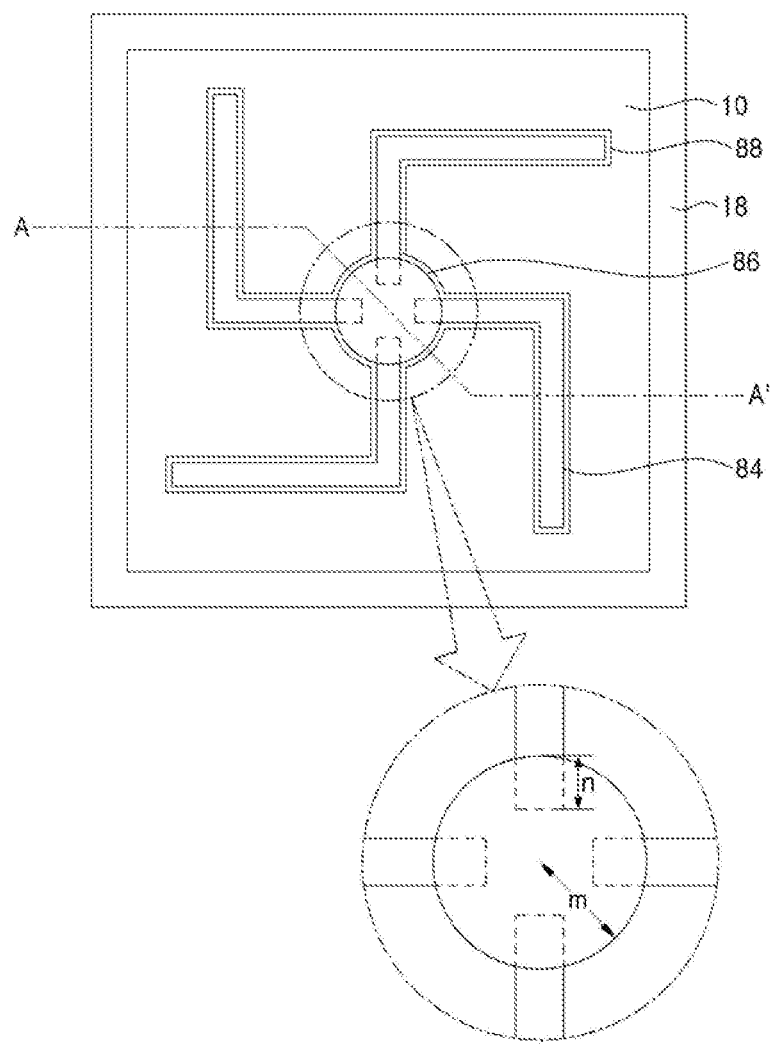

[Fig. 3]
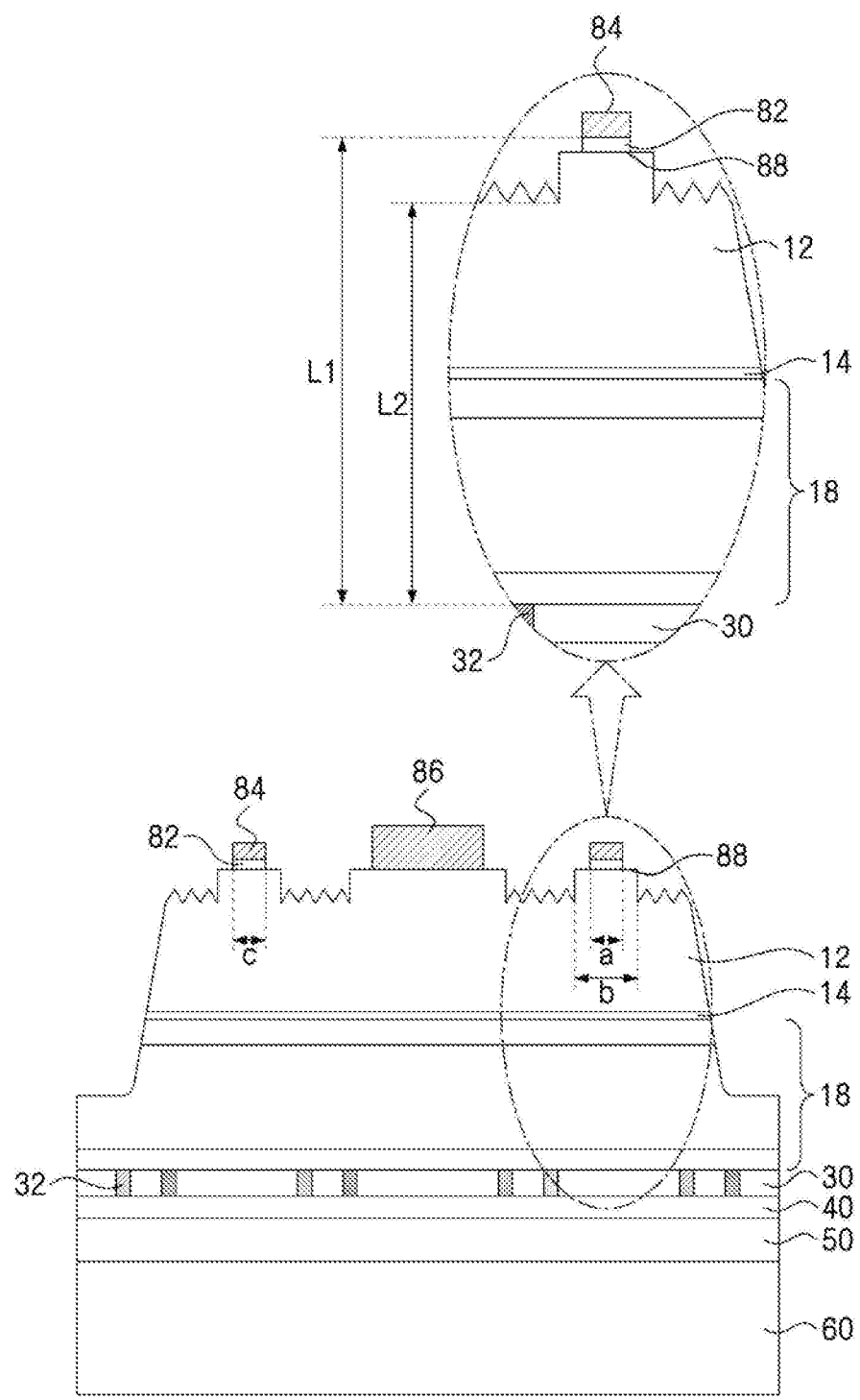

[Fig. 4]
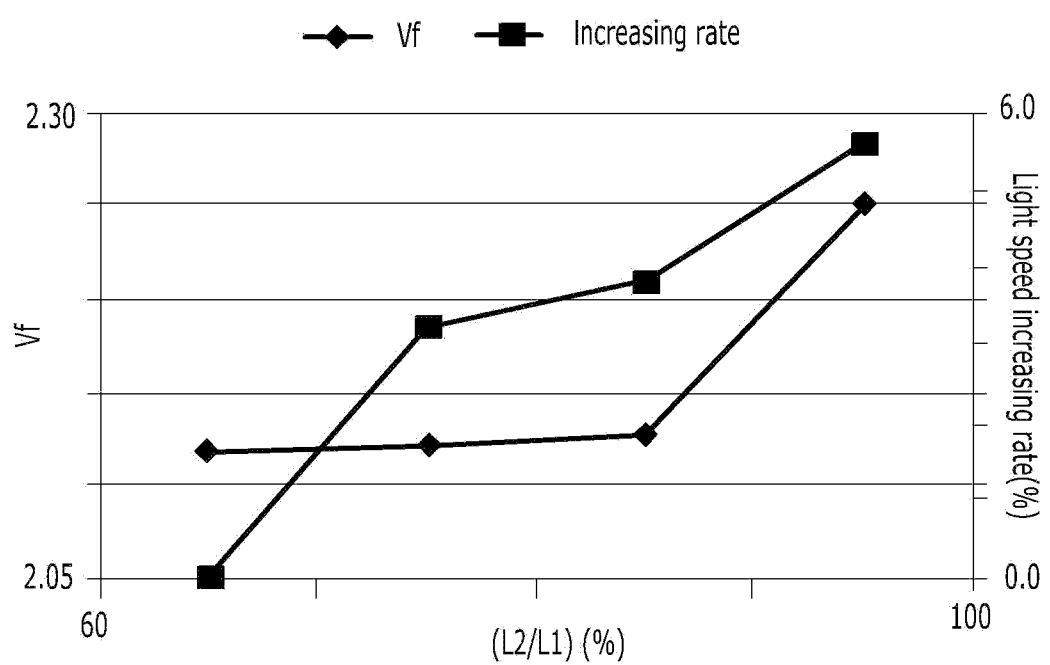

[Fig. 5]
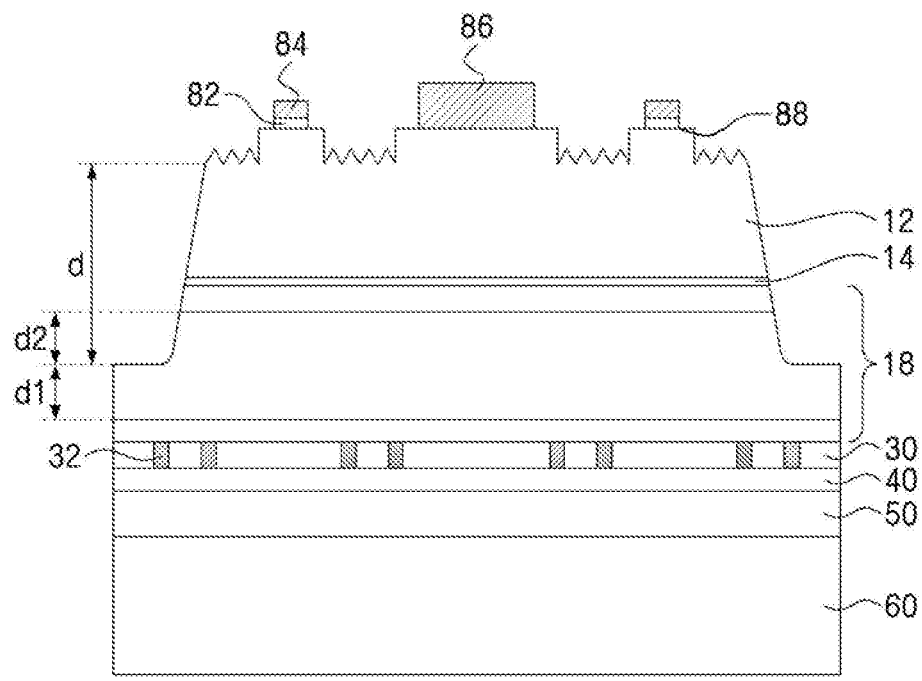

[Fig. 6]
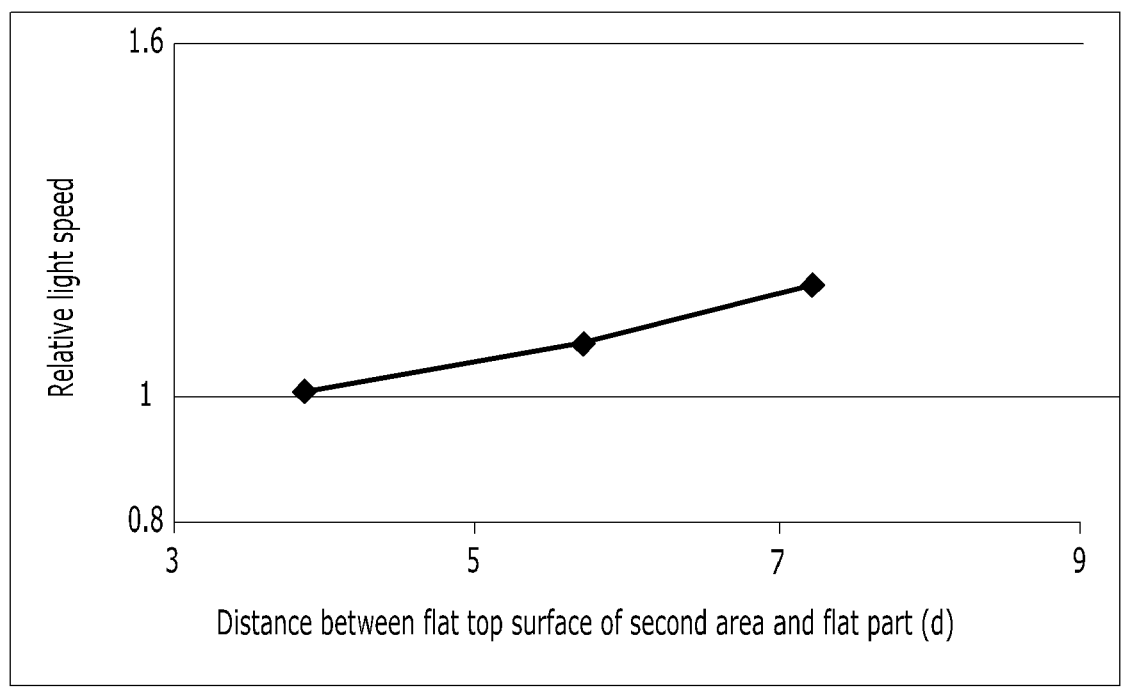

【Fig. 7】
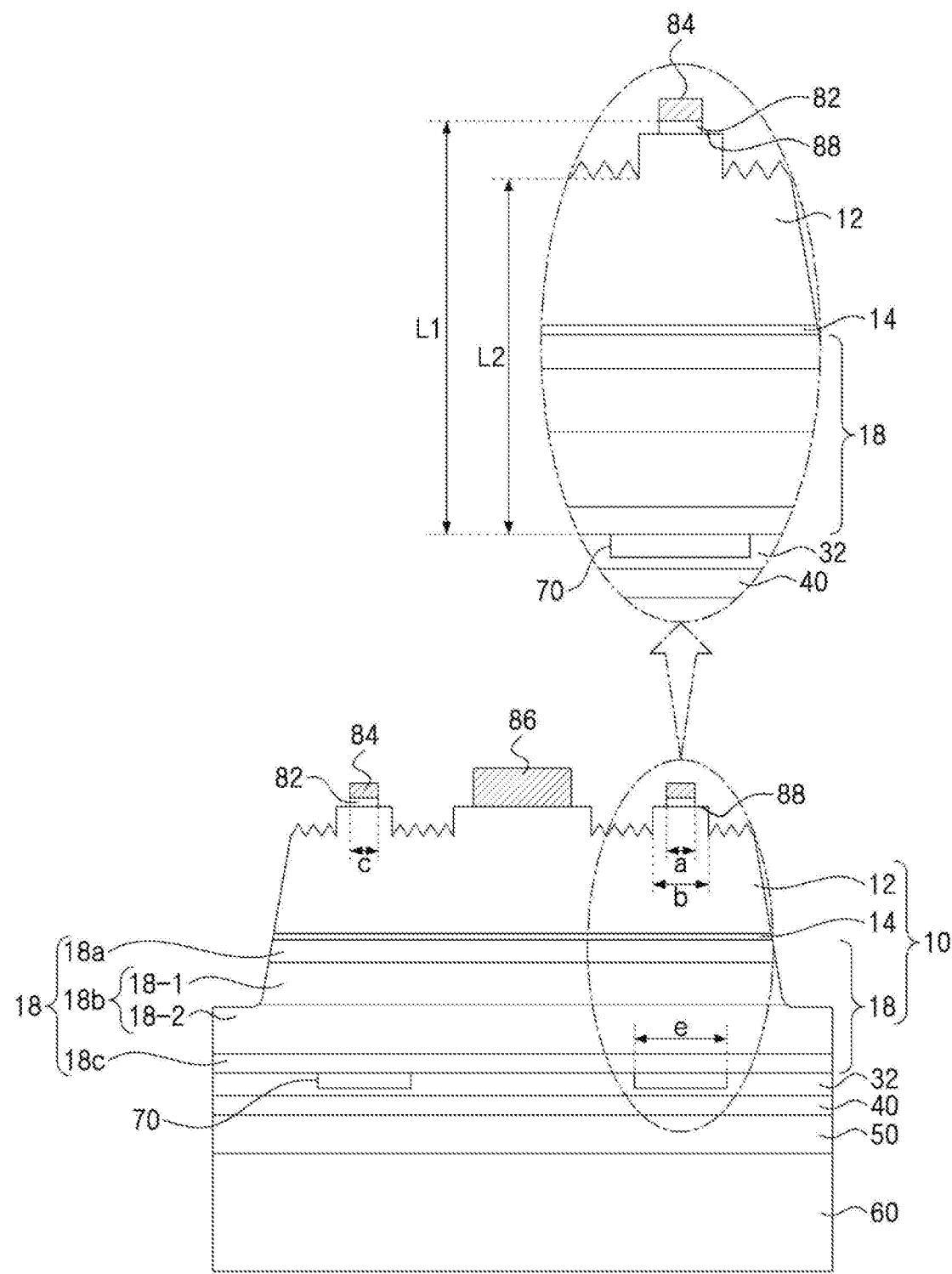

[Fig. 8]
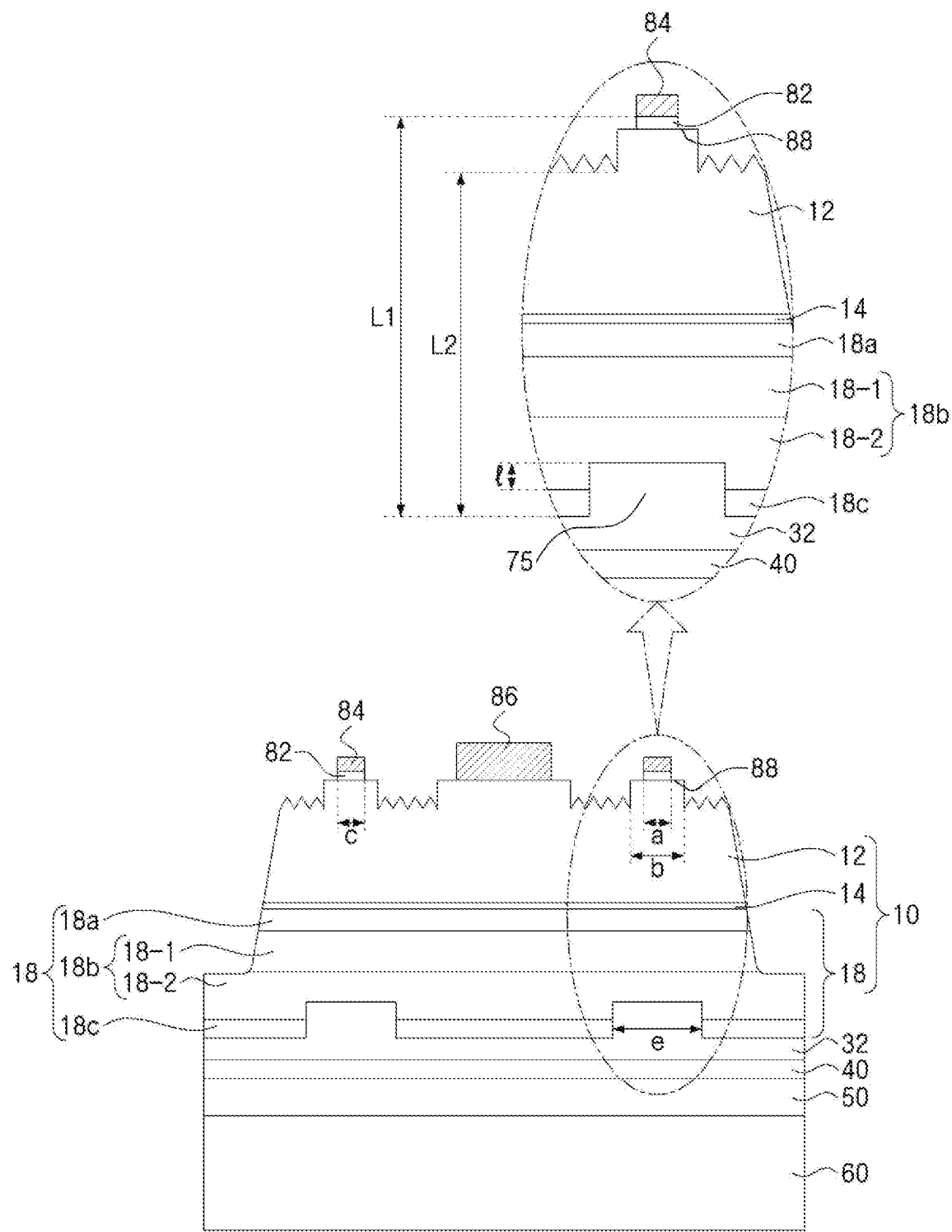

【Fig. 9】
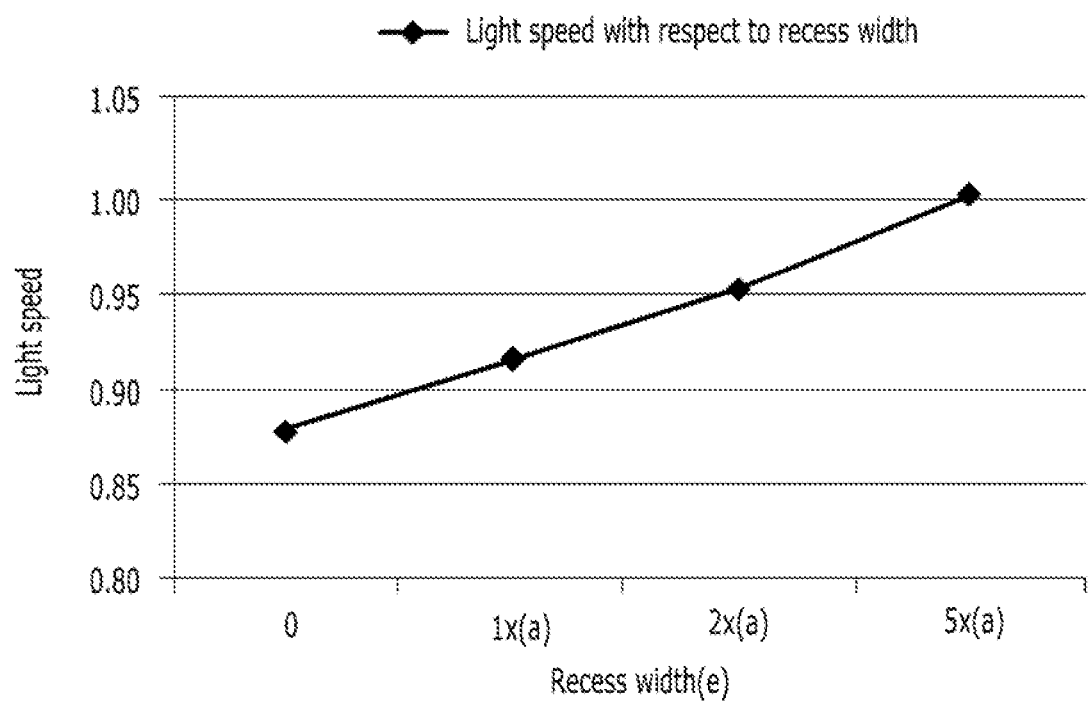

[Fig. 10]
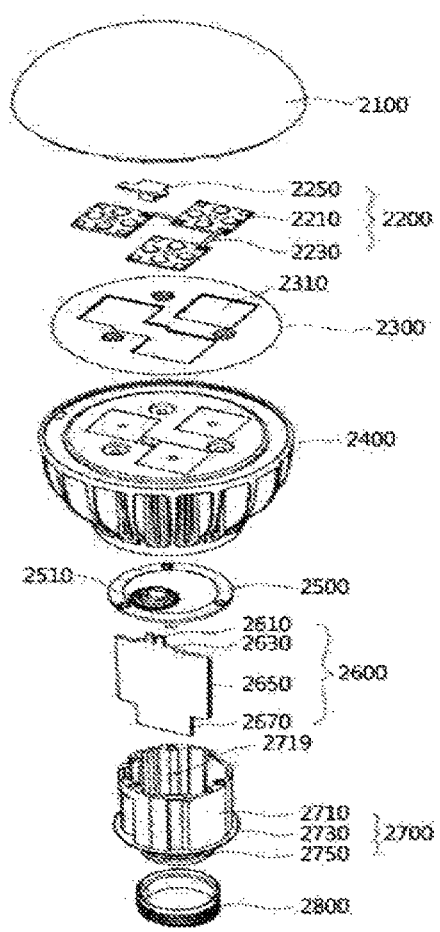

LIGHT-EMITTING SEMICONDUCTOR DEVICE HAVING FLAT PORTION AND CONCAVE-CONVEX PORTION FOR ENHANCED LIGHT EXTRACTION EFFICIENCY

CROSS REFERENCE TO RELATED APPLICATIONS

This application is the National Phase of PCT International Application No. PCT/KR2018/006484, filed on Jun. 7, 2018, which claims priority under 35 U.S.C. 119(a) to Patent Application No. 10-2017-0070764, filed in the Republic of Korea on Jun. 7, 2017, all of which are hereby expressly incorporated by reference into the present application.

FIELD OF THE INVENTION

The present invention relates to a semiconductor device.

BACKGROUND ART

Since semiconductor devices including compounds such as GaN, AlGaN, InGaNm InAlGaN, GaAs, AlGaAs, InGaAs, GaP, AlGaInP, InP and the like have many advantages of having a wide and easily adjustable band gap energy and the like, they are diversely used as a light emitting device, a light receiving device and various diodes.

Particularly, a light emitting device, such as a light emitting diode or a laser diode using a group III-V or II-VI compound semiconductor material of semiconductor, may implement diverse colors such as red, green, blue and infrared owing to development of thin film growth techniques and device materials, may also implement white light of a good efficiency by using a fluorescent material or adjusting color, and has advantages of low power consumption, semi-permanent lifespan, fast response speed, stability, eco-friendliness and the like compared with existing light sources such as a fluorescent tube, an incandescent bulb and the like.

In addition, when a light receiving device such as an optical detector or a solar cell is manufactured using a group III-V or II-VI compound semiconductor material of semiconductor, the light receiving device may absorb light of various wavelength ranges and generate optical current owing to development of various device materials, and thus light of various wavelength ranges from the gamma ray to the radio wavelength range can be used. In addition, since the light receiving device has advantages of fast response speed, stability, eco-friendliness, and easy adjustment of device materials, it can be conveniently used for power control, super high frequency circuits or communication modules.

Accordingly, application of the semiconductor devices is expanded to a transmission module of an optical communication means, a light emitting backlight substituting for a cold cathode fluorescent lamp (CCFL) of a liquid crystal display (LCD) device, a white light emitting diode lighting apparatus which can substitute for a fluorescent tube or an incandescent bulb, a headlight or a signal light of a vehicle, a sensor for sensing gas or fire, a medical device and the like. In addition, application of the semiconductor devices may be expanded to high frequency application circuits, power control devices, and communication modules.

Various developments such as improving a light extraction structure and the like are made recently to enhance light speed, light emitting efficiency, and electrical characteristics of the semiconductor devices.

SUMMARY OF THE INVENTION

Therefore, the present invention has been made in view of the above problems, and it is an object of the present invention to provide a semiconductor device with improved current crowding phenomenon and enhanced optical and electrical characteristics and reliability.

To accomplish the above object, according to one aspect of the present invention, there is provided a semiconductor device comprising: a conductive substrate; a semiconductor structure disposed on the conductive substrate and including a first conductive semiconductor layer, a second conductive semiconductor layer, and an active layer disposed between the first conductive semiconductor layer and the second conductive semiconductor layer; and a first electrode disposed on the semiconductor structure and electrically connected to the first conductive semiconductor layer, wherein the semiconductor structure further includes a 1-1 conductive semiconductor layer between the first conductive semiconductor layer and the first electrode, and the top surface of the semiconductor structure includes a flat part, on which the first electrode is disposed, and a concave-convex part surrounding the flat part, wherein a second distance from the bottom surface of the semiconductor structure to the bottom surface of the concave-convex part contacting with the side surface of the flat part is 70 to 95% of a first distance from the bottom surface of the semiconductor structure to the top surface of the 1-1 conductive semiconductor layer.

In addition, the horizontal width of the 1-1 conductive semiconductor layer may be the same as the horizontal width of the first electrode.

In addition, the thickness of the 1-1 conductive semiconductor layer may be 100 to 1,000 Å.

In addition, the width of the top surface of the flat part may be two to three times of the width of the top surface of the first electrode.

In addition, the semiconductor device further includes a pad electrode, and the pad electrode may directly contact with the first conductive semiconductor layer.

In addition, the top surface of the first electrode may surround the top surface of the pad electrode, and the stacking structure of the first electrode may be different from the stacking structure of the pad electrode.

In addition, the top surface of the pad electrode may be disposed in a circular shape.

In addition, the ratio of the length of an area, in which the pad electrode and the first electrode are vertically overlapped, to the radius of the pad electrode may be 0 to 1.

In addition, the second conductive semiconductor layer may include a 2-1 conductive semiconductor layer closest to the active layer, and a 2-2 conductive semiconductor layer disposed on the bottom of the 2-1 conductive semiconductor layer, wherein the 2-1 conductive semiconductor layer and the 2-2 conductive semiconductor layer may be configured of different materials.

In addition, the second conductive semiconductor layer may further include a 2-2 conductive semiconductor layer including a first dopant and a second dopant, and a 2-3 conductive semiconductor layer disposed on the bottom of the 2-2 conductive semiconductor layer and including the first dopant and the second dopant, wherein concentration of the first dopant included in the 2-2 conductive semiconductor layer and concentration of the first dopant included in the 2-3 conductive semiconductor layer may be different from each other, and concentration of the second dopant included in the 2-2 conductive semiconductor layer and concentration of the second dopant included in the 2-3 conductive semiconductor layer may be different from each other.

In addition, the 2-2 conductive semiconductor layer may include a first area having a tilt angle the same as that of the side surface of the active layer, and a second area having a width larger than the horizontal width of the first area, and the ratio of the thickness of the first area to the thickness of the second area may be 1:1 to 2:3.

According to another aspect of the present invention, there is provided a semiconductor device comprising: a conductive substrate; a semiconductor structure disposed on the conductive substrate and including a first conductive semiconductor layer, a second conductive semiconductor layer, and an active layer disposed between the first conductive semiconductor layer and the second conductive semiconductor layer; a first electrode electrically connected to the first conductive semiconductor layer; a second electrode electrically connected to the second conductive semiconductor layer; and a current blocking unit disposed between the second conductive semiconductor layer and the second electrode, wherein the current blocking unit may further include a plurality of recesses, and the first electrode and the current blocking unit may be vertically overlapped, and the horizontal width of the current blocking unit may be one to five times of the horizontal width of the first electrode.

In addition, the second conductive semiconductor layer may include a 2-1 conductive semiconductor layer closest to the active layer, and a 2-2 conductive semiconductor layer disposed on the bottom of the 2-1 conductive semiconductor layer, wherein the 2-1 conductive semiconductor layer and the 2-2 conductive semiconductor layer may be configured of different materials.

In addition, the thickness of the 2-2 conductive semiconductor layer may be 1 to 4 um.

In addition, the second conductive semiconductor layer may further include a 2-2 conductive semiconductor layer including a first dopant and a second dopant, and a 2-3 conductive semiconductor layer disposed on the bottom of the 2-2 conductive semiconductor layer and including the first dopant and the second dopant, wherein concentration of the first dopant included in the 2-2 conductive semiconductor layer and concentration of the first dopant included in the 2-3 conductive semiconductor layer may be different from each other, and concentration of the second dopant included in the 2-2 conductive semiconductor layer and concentration of the second dopant included in the 2-3 conductive semiconductor layer may be different from each other.

In addition, the plurality of recesses may pass through the 2-3 conductive semiconductor layer and expose part of the 2-2 conductive semiconductor layer.

In addition, the plurality of recesses may be disposed to expose 0 to 50% of the thickness of the 2-2 conductive semiconductor layer.

In addition, the width of the plurality of recesses may be one to five times of the width of the first electrode.

Advantageous Effects

The present invention may enhance light speed by improving the current spreading phenomenon of a semiconductor device.

BRIEF DESCRIPTION OF THE DRAWINGS

FIG. 1 is a side view showing a semiconductor device according to a first embodiment.

FIG. 2 is a top view showing a semiconductor device according to a first embodiment.

FIG. 3 is a cross-sectional view showing the semiconductor device according to a first embodiment, taken along the line A-A' in FIG. 2.

FIG. 4 is a graph showing light speed and operation voltage according to a second distance with respect to a first distance (L2/L1).

FIG. 5 is a cross-sectional view of a semiconductor device according to a first embodiment showing the distance between the flat top surface of a second area and a flat part, thickness of the first area, and thickness of a second area.

FIG. 6 is a graph showing light speed with respect to the distance between the flat top surface of a second area and a flat part.

FIG. 7 is a cross-sectional view showing a semiconductor device according to a second embodiment, taken along the line A-A' in FIG. 2.

FIG. 8 is a cross-sectional view showing a semiconductor device according to a second embodiment including a plurality of recesses.

FIG. 9 is a graph showing light speed with respect to a recess width.

FIG. 10 is an exploded perspective view showing a light source device according to an embodiment.

DETAILED DESCRIPTION OF THE EMBODIMENTS

Details of the object and technical configuration of the present invention described above and operational effects according thereto will be clearly understood hereinafter by the detailed description. In the description of the present invention, if a substrate, a layer (film), a region, a pattern or a structure is referred to as being formed or disposed "up/on" or "down/under" another substrate, layer (film), region, pad or pattern, it can be "directly" formed or disposed "on" or "under" the other element or "indirectly" formed or disposed with the intervention of other layer. The reference of "on" or "under" of each layer is defined with respect to the drawings.

The embodiments may be modified in different forms, or several embodiments may be combined with each other, and the scope of the present invention is not limited to the embodiments described below.

Although a matter described in a specific embodiment is not described in another embodiment, it may be understood as a description related to another embodiment as far as an opposed or contradictory description is not specially specified in another embodiment.

For example, if features of configuration A are described in a specific embodiment and features of configuration B are described in another embodiment, although an embodiment combining configuration A and configuration B is not specifically disclosed, it should be understood that it is included in the scope of the present invention as far as an opposed or contradictory description is not specified.

The terms such as "first" and "second" used below are only identification symbols for distinguishing the same or corresponding constitutional elements, and the same or corresponding constitutional elements are not limited by the terms such as "first" and "second".

Singular forms are intended to include plural forms unless the context clearly indicates otherwise. It will be further understood that the terms "include", "comprise" or "have" specify the presence of features, numerals, operations, components, parts or a combination thereof stated in this specification, and one or more other features, numerals, steps, operations, components, parts, or a combination thereof can be added.

Hereinafter, the present invention will be described in detail with reference to the accompanying drawings.

FIG. 1 is a side view showing a semiconductor device according to a first embodiment, and FIG. 2 is a top view showing a semiconductor device according to a first embodiment.

As shown in FIG. 1, a semiconductor device 100 according to a first embodiment may include a semiconductor structure 10, a conductive substrate 60, a first reflection layer 30, a second electrode 32, a second reflection layer 40, a bonding layer 50, a first electrode 84, and a pad electrode 86.

The semiconductor structure 10 is disposed on the conductive substrate 60 and may include a first conductive semiconductor layer 12, a second conductive semiconductor layer 18, and an active layer 14 disposed between the first conductive semiconductor layer 12 and the second conductive semiconductor layer 18.

The first conductive semiconductor layer 12 includes a compound semiconductor of group III-V or II-VI, for example, a semiconductor having a composition formula of $InX_a1y1Ga1-x1-y1N$ ($0 \leq x1 \leq 1$, $0 \leq y1 \leq 1$, $0 \leq x1+y1 \leq 1$), and may include at least one among GaN, AlGaN, InGaN and InAlGaN.

A first dopant may be doped on the first conductive semiconductor layer 12. Although the first conductive dopant may include Si, Ge, Sn, Se, Te or the like as an n-type dopant when the first conductive semiconductor layer 12 is an n-type semiconductor, it is not limited thereto.

The first conductive semiconductor layer 12 may be configured as a single layer or multiple layers, and the pad electrode 86 and the first electrode 84 may be disposed on the top of the first conductive semiconductor layer 12, and a step unit may be disposed on both sides of the first conductive semiconductor layer 12 on which the first electrode 84 is disposed.

The top surface of the semiconductor structure 10 may include a flat part 88 on which the first electrode 84 and the pad electrode 86 are disposed and a concave-convex part having depressions and prominences. The concave-convex part may be disposed to surround the flat part 88.

A 1-1 conductive semiconductor layer 82 may be disposed on the flat part 88, and the first electrode 84 may be disposed on the 1-1 conductive semiconductor layer 82. The 1-1 conductive semiconductor layer 82 may be disposed to enhance the current injection characteristic between the first conductive semiconductor layer 12 and the first electrode 84, and the horizontal width of the first electrode 84 may be the same as the horizontal width of the 1-1 conductive semiconductor layer 82. Accordingly, through the 1-1 conductive semiconductor layer 82, the current injection characteristic between the first electrode 84 and the first conductive semiconductor layer 12 can be enhanced, and the light extraction efficiency of the semiconductor device can be enhanced.

The width of the flat part 88 may be the same as or larger than the width of the 1-1 conductive semiconductor layer 82. The horizontal width of the flat part 88 may be larger than the width of the first electrode 84 to secure a processing margin in the process of disposing the first electrode 84.

The active layer 14 may include a quantum well and a quantum barrier. When the active layer 14 is implemented as a multiple quantum well structure, quantum wells and quantum barriers may be alternately disposed.

The active layer 14 is a layer in which electrons (holes) injected through the first conductive semiconductor layer 12 and electrons (holes) injected through the second conductive semiconductor layer 18 recombine at the quantum well of the active layer 14, and light is emitted by a band gap difference of an energy band corresponding to the constituent material of the quantum well, and it can be disposed between the first conductive semiconductor layer 12 and the second conductive semiconductor layer 18. In addition, the wavelength of the emitted light may have an inverse proportional relation with the energy band gap.

The active layer 14 may be configured of a compound semiconductor and implemented using at least one or more among, for example, II-V and III-VI compound semiconductors.

Although the active layer 14 may include at least one among a single quantum well, a multiple quantum well (MQW), a quantum wire structure and a quantum dot structure, it is not limited thereto.

The second conductive semiconductor layer 18 includes a compound semiconductor of group III-V or II-VI, for example, a semiconductor having a composition formula of $Inx5AlyGa-x5-y2N$ ($0 \leq x5 \leq 1$, $0 \leq y2 \leq 1$, $0 \leq x5+y2 \leq 1$), and may include at least one among AlInN, AlGaAs, GaP, GaAs, GaAsP and AlGaInP.

A second dopant may be doped on the second conductive semiconductor layer 18. Although the second conductive dopant may include Mg, Wn, Ca, Sr, C, Ba or the like as a p-type dopant when the second conductive semiconductor layer 18 is a p-type semiconductor, it is not limited thereto.

Although it is described in a first embodiment assuming that the first conductive semiconductor layer 12 is an n-type semiconductor and the second conductive semiconductor layer 18 is a p-type semiconductor, it is not limited thereto, and the first conductive semiconductor layer 12 may be configured of a p-type semiconductor, and the second conductive semiconductor layer 18 may be configured of an n-type semiconductor.

Although it is not shown, an electron block layer (EBL) may be disposed between the active layer 14 and the second conductive semiconductor layer 18. The electron block layer (EBL) may enhance the light emitting efficiency by increasing the probability of radiative recombination of electrons and holes in the active layer 14 by blocking the electrons (holes) supplied from the first conductive semiconductor layer 12 and flowing to the second conductive semiconductor layer 18. The energy band gap of the electron block layer may be larger than the energy band gap of the active layer 14 or the second conductive semiconductor layer 18.

The second conductive semiconductor layer 18 may be disposed between the active layer 14 and the conductive substrate 60, and the second conductive semiconductor layer 18 may include a 2-1 conductive semiconductor layer 18a and a 2-2 conductive semiconductor layer 18b.

The 2-1 conductive semiconductor layer 18a and the 2-2 conductive semiconductor layer 18b may be configured of materials different from each other.

For example, when the 2-1 conductive semiconductor layer 18a is configured of a material such as AlGaAs, AlGaInP, InGaAs, InAlGaAS or the like, the 2-2 conductive semiconductor layer 18b may be configured of a material such as GaP, AlGaAS, AlGaInP, InGaAs, InAlGaAs or the like, and they may be configured of materials different from each other. When they are configured of materials different from each other, the 2-2 conductive semiconductor layer 18b may have a current spreading function, and the 2-1 conductive semiconductor layer 18a may have a function of injecting current into the active layer 14.

A 2-3 conductive semiconductor layer 18c may be configured of a material the same as that of the 2-2 conductive semiconductor layer 18b and may include a different dopant. In addition, the first conductive semiconductor layer 12 may include at least one or more dopants. The 2-2 conductive semiconductor layer 18b may include a first dopant and a second dopant, and the 2-3 conductive semiconductor layer 18c may include the first dopant and the second dopant. Concentration of the first dopant included in the 2-2 conductive semiconductor layer 18b and concentration of the first dopant included in the 2-3 conductive semiconductor layer 18c may be different from each other, and concentration of the second dopant included in the 2-2 conductive semiconductor layer 18b and concentration of the second dopant included in the 2-3 conductive semiconductor layer 18c may be different from each other.

For example, when the first dopant is Mg and the second dopant is C, concentration of Mg included in the 2-2 conductive semiconductor layer 18b may be higher than concentration of Mg included in the 2-3 conductive semiconductor layer 18c, and concentration of C included in the 2-2 conductive semiconductor layer 18b may be lower than concentration of C included in the 2-3 conductive semiconductor layer 18c. Since the 2-3 conductive semiconductor layer 18c may include a dopant different from the dopant included in the 2-2 conductive semiconductor layer 18b to smoothly inject current from the second electrode 32 to the second conductive semiconductor layer 18, and the 2-2 conductive semiconductor layer 18b has a resistance lower than that of the 2-3 conductive semiconductor layer 18c, the optical characteristics of the semiconductor device can be enhanced by smoothly injecting current into the active layer 14. For example, the 2-2 conductive semiconductor layer 18b may include Mg, and the 2-3 conductive semiconductor layer 18c may include C.

The 2-2 conductive semiconductor layer 18b may be thicker than the 2-1 conductive semiconductor layer 18a. When the 2-2 conductive semiconductor layer 18b is thicker than the 2-1 conductive semiconductor layer 18a, current can be easily spread in the 2-1 conductive semiconductor layer 18a, and uniformity of the current density of the current injected into the 2-1 conductive semiconductor layer 18a can be enhanced.

The 2-2 conductive semiconductor layer 18b may include a first area 18-1 including a side surface having a tilt angle the same as those of the side surface of the active layer 14 and the side surface of the 2-1 conductive semiconductor layer 18a, and a second area 18-2 having a width larger than the horizontal width of the first area.

The first area 18-1 and the second area 18-2 may be configured of the same material, and a step unit may be provided between the side surface of the first area 18-1 and the side surface of the second area 18-2, and the step unit may include an area having a curvature.

As the step unit is disposed, current may be more uniformly injected from the bottom of the second area 8-2 into the first area 18-1 narrower than the second area 8-2.

In addition, the light emitted from the active layer 14 to the bottom of the semiconductor device and reflected by the first reflection layer 30 or the second reflection layer 40 toward the top of the semiconductor device may be emitted to the outside of the semiconductor structure 10 without being absorbed into the active layer 14.

Some areas of the step unit may further include an area having a curvature. The area having a curvature may be a boundary area of a medium that the light reflected from the first reflection layer 30 or the second reflection layer 40 toward the top of the semiconductor device meets. The total reflection condition of reflecting again the light, which is reflected from the first reflection layer 30 or the second reflection layer 40 toward the top of the semiconductor device, toward the first reflection layer 30 or the second reflection layer 40 from the boundary area may be mitigated by the Snell's law, and accordingly, the light extraction efficiency of the semiconductor device can be enhanced.

The second electrode 32 may be disposed on the bottom of the semiconductor structure 10. The second electrode 32 may be disposed on the bottom of the 2-2 conductive semiconductor layer 18b of the semiconductor structure 10. The second electrode 32 may be electrically connected to the 2-2 conductive semiconductor layer 18b.

The second electrode 32 may be configured of a material having a good electrical contact. The second electrode 32 may be formed as a single layer or multiple layers. Although the second electrode 32 may include at least one among Ag, Ni, Cr, Ti, Al, Rh, Pd, Ir, Ru, Mg, Zn, Pt, Au, Hf, Be, Ge, ITO (Indium tin oxide), IZO (Indium zinc oxide), IZTO (Indium zinc tin oxide), IAZO (indium aluminum zinc oxide), IGZO (indium gallium zinc oxide), IGTO (indium gallium tin oxide), AZO (aluminum zinc oxide), ATO (Antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au and Ni/IrOx/Au/ITO, it is not limited thereto.

The second electrode 32 may include a plurality of openings. The second electrode 32 has a pattern and may include a plurality of openings R penetrating between the top surface and the bottom surface of the second electrode 32. The top surface and the bottom surface of the plurality of openings R included in the second electrode 32 may be a circular shape, an oval shape or a polygonal shape, it is not limited thereto.

In addition, the second electrode 32 may be disposed as a plurality of patterns spaced apart from each other.

The first reflection layer 30 may be disposed inside the plurality of openings R or between the plurality of patterns. Although the first reflection layer 30 may directly contact with the bottom surface of the second conductive semiconductor layer 18, it is not limited thereto.

The first reflection layer 30 may be configured of an insulation material having transmittance and refractive index. For example, the first reflection layer 30 may include at least one among SixOy, SixNy, Al2O3, ZnO, ITO, TiO2, and HfOx and may be disposed in a distributed Bragg-reflector (DBR) structure in which different insulation materials having different refractive indexes are disposed as a single layer or multiple layers. In addition, the first reflection layer 30 may have a metal material disposed to form a Schottky contact with the semiconductor structure. However, it is not limited thereto, and the first reflection layer 30 may be disposed as a stacking structure including at least one or more among an insulation material and a metal material having transmittance and/or refractive index. As the first reflection layer 30 is disposed inside the plurality of openings R or between the plurality of patterns, current injection may not be smooth in the area where the first reflection layer 30 is disposed, compared with the area where the second reflection layer 32 is disposed. Accordingly, uniformity of current density of the current injected from the second electrode 32, in which injection of current is comparatively easy, to the second conductive semiconductor layer 18 can be enhanced.

The second reflection layer 40 may be configured as a single layer or multiple layers. The second reflection layer 40 may be configured of a material having a good electrical contact and high reflectivity. The second reflection layer 40 may be configured of a metal or an alloy including at least one among Pd, Ir, Ru, Mg, Zn, Pt, Ag, Ni, Al, Rh, Au, Ti, Hf and ITO.

The second reflection layer 40 may be configured of a metal and electrically connected to the second electrode 32. When the second electrode 32 has a plurality of openings R or is disposed as patterns spaced apart from each other, the second electrode 32 may be electrically connected to the 2-2 conductive semiconductor layer 18b. In addition, as the second reflection layer 40 reflects the light emitted from the active layer 14 through the plurality of openings R or the spaced patterns toward the top, the optical characteristic of the semiconductor device can be enhanced.

The bonding layer 50 may include a barrier metal or a bonding metal. Although the bonding layer 50 may include at least one among Ti, Au, Sn, Nu, Cr, Ga, In, Bi, Cu, Ag, Nb, Pd and Ta, it is not limited thereto. The bonding layer 50 may be configured as a single layer or multiple layers. The bonding layer 50 is disposed between the conductive substrate 60 and the semiconductor structure 10 and may physically and electrically connect the semiconductor structure 10 and the conductive substrate 60.

The conductive substrate 60 may be a metal or carrier substrate. The conductive substrate 60 may be configured as a single layer or multiple layers.

The conductive substrate 60 may be configured of a material having a good electrical contact and may include, for example, at least one or more among Ni, Ti, Cr, Pt, Au, Sn, In, Pd, Cu and TiW, it is not limited thereto.

The first electrode 84 and the pad electrode 86 may be disposed on the semiconductor structure 10.

The first electrode 84 and the pad electrode 86 may be disposed on the semiconductor structure 10. At least one or more of the first electrode 84 and the pad electrode 86 may be disposed, and it is not limited thereto.

The first electrode 84 may have at least one or more branch electrodes. The first electrode 84 includes branch electrodes, and the branch electrodes may be disposed to be spaced apart from each other on the top surface of the first conductive semiconductor layer 12.

Accordingly, uniformity of the current injected into the first conductive semiconductor layer 12 can be enhanced through the at least one or more branch electrodes. As shown in FIG. 2, the branch electrode may have at least one or more extension units extended from an electrode connected to the pad electrode 86 in another direction.

The branch electrode may have at least one or more extension units for a case in which the current spreading characteristic of the first conductive semiconductor layer 12 is degraded or for a balance with the spreading characteristic of the current injected from the second conductive semiconductor layer 18 to the active layer 14, and the extension unit may be extended in a direction different from the direction of connecting the branch electrode to the pad electrode 86.

Although the pad electrode 86 may be disposed at the center area of the semiconductor structure 10, it is not limited thereto. Although the pad electrode 86 may be disposed on the first conductive semiconductor layer 12 and directly contact with the first conductive semiconductor layer 12, it is not limited thereto.

The resistance between the pad electrode 86 and the first conductive semiconductor layer 12 may be set to be higher than the resistance between the first electrode 84 and the first conductive semiconductor layer 12, and accordingly, the pad electrode 86 and the first electrode 84 may be configured of the same material or different materials. The resistance between the 1-1 conductive semiconductor layer 82 and the first electrode 84 may be lower than the resistance between the pad electrode 86 and the first conductive semiconductor layer 12.

Accordingly, since the current injected into the pad electrode 86 is not directly injected into the first conductive semiconductor layer 12, but injected into the first conductive semiconductor layer 12 through the first electrode 84, uniformity of the injected current can be improved. In an embodiment, as the constituent material of the first electrode 84 and the constituent material of the pad electrode 86 are selected to be different from each other and the 1-1 conductive semiconductor layer 82 is disposed between the first electrode 84 and the first conductive semiconductor layer 12, the current injection characteristic and the uniformity are improved. In addition, as the current spreading phenomenon is improved, optical output of the semiconductor device is enhanced. However, when the resistance between the first electrode 84 and the first conductive semiconductor layer 12 is lower than the resistance between the pad electrode 86 and the first conductive semiconductor layer 12, the 1-1 conductive semiconductor layer 82 may not be disposed.

The pad electrode 86 may be configured as a single layer or a plurality of layers and include at least any one among Ti, Cr, Ni, Al, Pt, Au, W, Cu, Mo, Rh, Ru, Ag and Cu—W, it is not limited thereto.

The first electrode 84 may be configured as a single layer or a plurality of layers and include at least any one among Ti, Cr, Ni, Al, Pt, Au, W, Cu, Mo, Rh, Ru, Ag and Cu—W, it is not limited thereto.

The 1-1 conductive semiconductor layer 82 includes a compound semiconductor of group III-V or II-VI, for example, a semiconductor having a composition formula of $InX1Aly1Ga1-x1-y1N$ ($0 \leq x1 \leq 1$, $0 \leq y1 \leq 1$, $0 \leq x1+y1 \leq 1$), and may include at least one among GaN, AlGaN, InGaN and InAlGaN.

The 1-1 conductive semiconductor layer 82 may be configured of a material such as the first conductive semiconductor layer 12.

Since the 1-1 conductive semiconductor layer 82 may absorb the light emitted from the active layer 14 toward the first conductive semiconductor layer 12, it may be disposed not to be larger than the width of the first electrode 84. To smoothly inject current from the first electrode 84 to the active layer 14, the width (c) of the 1-1 conductive semiconductor layer 82 may be set to be the same as the width of the first electrode 84. However, it is not limited thereto, and when the first electrode 84 is disposed after the 1-1 conductive semiconductor layer 82 area is disposed, the width (c) of the 1-1 conductive semiconductor layer 82 may be larger than the width of the first electrode 84 to secure a processing margin. In addition, when the width (c) of the 1-1 conductive semiconductor layer 82 is larger than the width of the first electrode 84, the width (c) of the 1-1 conductive semiconductor layer 82 may be smaller than the width of the top surface of the flat part 88 of the first conductive semiconductor layer 12 when the first electrode 84 is disposed to secure the light extraction efficiency of the semiconductor device.

Thickness of the 1-1 conductive semiconductor layer 82 may be 100 to 1,000 Å.

Since a defect may occur in the aspect of electrical characteristic when the thickness of the 1-1 conductive semiconductor layer 82 is smaller than 100 Å, the thickness of the 1-1 conductive semiconductor layer 82 may be equal to or larger than 100 Å.

Since the optical path, in which the light emitted from the active layer 14 toward the first conductive semiconductor layer 12 can be absorbed, may be extended when the thickness of the 1-1 conductive semiconductor layer 82 is equal to or larger than 1,000 Å, the thickness of the 1-1 conductive semiconductor layer 82 may be equal to or smaller than 1,000 Å.

Since the pad electrode 86, the first electrode 84 and the second conductive semiconductor layer 18 are the same as the configuration shown in FIG. 1, detailed description thereof will be omitted.

The first electrode 84 may include branch electrodes disposed to be spaced apart from each other. The branch electrodes of the first electrode 84 may be vertically overlapped with the pad electrode 86. In the area where the first electrode 84 and the pad electrode 86 are vertically overlapped, a first ratio n/m of the length n of the first electrode 84 to the radius m of the pad electrode 86 may be 0 to 1. When the first ratio n/m is equal to or smaller than 0, it is difficult to secure a margin in the process of disposing the first electrode 84 and the process of disposing the pad electrode 86, and accordingly, a problem of being unable to electrically connect the first electrode 84 and the pad electrode 86 may occur.

In addition, when the first ratio n/m is equal to or higher than 1, the branch electrodes may be disposed to be connected to each other, and when the branch electrodes are disposed to be connected to each other, the characteristic of spreading current toward the branch electrodes may be degraded by the resistance between the pad electrode 86 and the first conductive semiconductor layer 12.

Accordingly, the first ratio n/m may be 0 to 1 to secure the current spreading characteristic between the pad electrode 86 and the first conductive semiconductor layer 12 and electrically connect the pad electrode 86 and the branch electrodes.

Referring to FIG. 2, the 2-2 conductive semiconductor layer 18b may be disposed on the top surface of the semiconductor device to be extended toward the outside of the active layer 14 while surrounding the circumference of the semiconductor structure 10.

For example, the second area 18-2 of the 2-2 conductive semiconductor layer 18b may be disposed to be extended toward the outside of the active layer 14. Since the 2-2 conductive semiconductor layer 18b has a resistance higher than that of the 2-1 conductive semiconductor layer 18a, when the area of the top surface of the 2-2 conductive semiconductor layer 18b is disposed to be larger than the area of the top surface of the active layer 14, uniformity of the current density of injected current can be enhanced since the current injected into the second electrode 32 is injected into the active layer 14 through the 2-1 conductive semiconductor layer 18a.

The area of the top surface of the 2-2 conductive semiconductor layer 18b may be 10 to 30% of the area of the top surface of the semiconductor device.

When the area of the top surface of the 2-2 conductive semiconductor layer 18b is 10% or more than the area of the top surface of the semiconductor device, since the 2-2 conductive semiconductor layer 18b disposed around the semiconductor structure 10 is an area where a laser or a diamond wheel passes through when the semiconductor device is cut into individual devices after the manufacturing process of the semiconductor device, a processing margin for the cutting process may be secured.

Since it is difficult to secure a processing throughput of the semiconductor structure when the area of the top surface of the 2-2 conductive semiconductor layer 18b is 30% or more than the area of the top surface of the semiconductor device, the area of the top surface of the 2-2 conductive semiconductor layer 18b may be less than 30% of the area of the top surface of the semiconductor device to secure the processing throughput of the semiconductor device.

FIG. 3 is a cross-sectional view showing the semiconductor device according to a first embodiment, taken along the line A-A' in FIG. 2.

A first distance L1 from the bottom surface of the semiconductor structure 10 to the top surface of the 1-1 conductive semiconductor layer 82, a second distance L2 from the bottom surface of the semiconductor structure 10 to a concave-convex part disposed closest to the flat part 88, the width b of the flat part, and the width (a) of the first electrode will be described in detail with reference to FIG. 3.

The top surface of the semiconductor structure 10 may include a flat part 88 on which the first electrode 84 and the pad electrode 86 are disposed and a concave-convex part having depressions and prominences. When the semiconductor structure 10 includes the 1-1 conductive semiconductor layer 82 and a concave-convex part is disposed on the top surface of the semiconductor structure 10, thickness of the 1-1 conductive semiconductor layer 82 may be reduced extremely or the 1-1 conductive semiconductor layer 82 may be damaged. Since the resistance between the first electrode 84 and the first conductive semiconductor layer 12 may increase when the 1-1 conductive semiconductor layer 82 is very thin or damaged, a flat surface may be disposed on the top surface of the semiconductor structure 10 on which the first electrode 84 is disposed.

The width b of the flat part 88 is larger than the width (a) of the first electrode 84. The width b of the flat part 88 may be at least two to three times of the width (a) of the first electrode. When the width b of the flat part 88 is two or more times of the width (a) of the first electrode, a processing margin of disposing the concave-convex part may be secured so that the first electrode 84 may not be damaged in the process of disposing the flat part 88.

Since the large amount of current flowing toward the side surface of the first conductive semiconductor layer 12 can be suppressed when the width b of the flat part is equal to or smaller than three times of the width (a) of the first electrode, the amount of current injected into the active layer 14 can be secured, and the probability of absorbing again the light emitted from the active layer 14 may be lowered. In addition, since the area of the concave-convex part that can be disposed on the top surface of the semiconductor structure 10 can be secured, the light extraction efficiency of the semiconductor can be enhanced.

Accordingly, to secure the optical and electrical characteristics of the semiconductor device, the width b of the flat part may be two to three times of the width (a) of the first electrode.

The first distance L1 may be the distance from the bottom surface of the semiconductor structure 10 to the top surface of the 1-1 conductive semiconductor layer 82.

The second distance L2 may be the distance from the bottom surface of the semiconductor structure 10 to the concave-convex part contacting with the flat part 88 or the distance between a concave part, which is a concave portion of the concave-convex part, and the bottom surface of the semiconductor structure 10. The top surface of the concave-convex part may have a uniform pattern shape or may be disposed unevenly. In addition, the height of the convex part may be uneven on the basis of the concave part, or the concave part may be uneven on the basis of the convex part. Accordingly, the second distance L2 will be described on the basis of the concave part contacting with the flat surface.

Since the first distance L1 and the second distance L2 are different from each other, thickness of the first conductive semiconductor layer 12 may be different on the concave-convex part and the flat part 88, and resistance may be different on the flat part 88 and the concave-convex part of the first conductive semiconductor layer 12. Thickness of the first conductive semiconductor layer 12 at the concave-convex part may be smaller than the thickness of the first conductive semiconductor layer 12 at the flat part 88, and in this case, since the resistance of the first conductive semiconductor layer 12 at the concave-convex part is higher than the resistance of the first conductive semiconductor layer 12 at the flat part 88, if thickness of the first conductive semiconductor layer 12 at the concave-convex part is not secured, spread of the current injected into the flat part 88 toward the concave-convex part may be difficult. Meanwhile, thickness of the first conductive semiconductor layer 12 at the concave-convex part may be set to be smaller than the thickness of the first conductive semiconductor layer 12 at the flat surface, and the light extraction efficiency of the semiconductor device can be enhanced by the depressions and prominences disposed on the concave-convex part. In this manner, the electrical characteristic and/or optical characteristic of the semiconductor device can be secured by adjusting the ratio of the first distance L1 to the second distance L2.

In this embodiment, the second distance L2 may be 70 to 95% of the first distance L1.

Referring to FIG. 4, it can be confirmed that the electrical characteristic of the semiconductor device may be secured when the second distance L2 is 70% or more than the first distance L1, and the optical characteristic of the semiconductor device may be secured when the second distance L2 is 95% or less than the first distance L1.

When the second distance L2 is set to be 70% or more than the first distance L1, the electrical characteristic of the semiconductor device may be secured as the thickness of the first conductive semiconductor layer 12 at the concave-convex part increases, and when the second distance L2 is set to be 95% or less than the first distance L1, the optical characteristic of the semiconductor device may be secured as the thickness of the first conductive semiconductor layer 12 at the concave-convex part decreases.

FIG. 5 is a cross-sectional view of the semiconductor device according to a first embodiment, taken along the line A-A' in FIG. 2, showing the distance d between the flat top surface of the second area 18-2 and the flat part 88, thickness d1 of the first area, and thickness d2 of the second area, and FIG. 6 is a graph showing light speed with respect to the distance d between the flat top surface of the second area 18-2 and the flat part 88.

As shown in FIG. 5, the 2-2 conductive semiconductor layer 18b may include a first area 18-1 including a side surface having a tilt angle the same as those of the side surface of the active layer 14 and the side surface of the 2-1 conductive semiconductor layer 18a, and a second area 18-2 having a width larger than the horizontal width of the first area 18-1.

The first area 18-1 and the second area 18-2 may be configured of the same material, and a step unit or an area having a curvature may be provided between the side surface of the first area 18-1 and the side surface of the second area 18-2.

The 2-2 conductive semiconductor layer 18b has a uniform thickness d1+d2, and if thickness of the first area is referred to as a first thickness d1 and thickness of the second area is referred to as a second thickness d2, the ratio of the first thickness d1 to the second thickness d2 may be 1:1 to 2:3.

When the ratio of the first thickness d1 to the second thickness d2 is 1:1 or higher, the second thickness d2 is larger than the first thickness d1, and light speed of the semiconductor device can be enhanced as the light speed decrease phenomenon is prevented.

When the ratio of the first thickness d1 to the second thickness d2 is 2:3 or higher, a leakage current may be generated as the metal on the bottom is exposed. Accordingly, the ratio of the first thickness d1 to the second thickness d2 may be 2:3 or lower to secure the reliability of the semiconductor device by preventing the leakage current.

It can be confirmed through FIG. 6 that light speed is enhanced as the distance d between the flat top surface of the second area 18-2 and the flat part 88 increases.

The distance d between the flat top surface of the second area 18-2 and the flat part 88 includes the second thickness d2, and the distance d between the flat top surface of the second area 18-2 and the flat part 88 may increase or decrease according to the second distance d2.

If the second thickness d2 is small, the distance d between the flat top surface of the second area 18-2 and the flat part 88 also decreases, and light speed of the semiconductor device may be lowered.

In addition, if the second thickness d2 is large, the distance d between the flat top surface of the second area 18-2 and the flat part 88 increases, and light speed of the semiconductor device can be enhanced. However, if the side surface of the semiconductor structure 10 is entirely exposed to the outside, a leakage current is generated, and a problem of degrading the reliability of the semiconductor device may occur.

Accordingly, the distance d between the flat top surface of the second area 18-2 and the flat part 88, including the second thickness d2, may be selected considering the reliability and light speed of the semiconductor device.

FIG. 7 is a view showing a semiconductor device according to a second embodiment.

As shown in FIG. 7, a semiconductor device 100 according to a second embodiment may include a semiconductor structure 10, a conductive substrate 60, a second electrode 32, a second reflection layer 40, a bonding layer 50, a first electrode 84, a pad electrode 86, and a current blocking unit 70.

Since the semiconductor structure 10 including a first conductive semiconductor layer 12, a second conductive semiconductor layer 18 and an active layer 14, the conductive substrate 60, the first reflection layer 30, the second electrode 32, the second reflection layer 40, the bonding layer 50, the first electrode 84, and the pad electrode 86 are the same as the configuration of the semiconductor device according to a first embodiment, detailed description thereof will be omitted.

Thickness of the 2-2 conductive semiconductor layer 18b according to a second embodiment may be 1 to 4 um.

When the thickness of the 2-2 conductive semiconductor layer 18b is 1 um or more, the 2-2 conductive semiconductor layer 18b may have a current spreading function.

When the thickness of the 2-2 conductive semiconductor layer 18b is 4 um or less, as the flow of current in the vertical direction is prevented through the current blocking unit 70, a wider light emitting area can be utilized, and uniform and bright surface light emission can be obtained.

Accordingly, thickness of the 2-2 conductive semiconductor layer 18b may be 1 to 4 um to secure the current spreading function and the effect by the current blocking unit 70.

The current blocking unit 70 may be disposed between the second conductive semiconductor layer 18 and the second electrode 32.

As the current blocking unit 70 is disposed, flow of current only in the vertical direction is prevented, and uniform and bright surface light emission can be obtained.

Although the current blocking unit 70 may be configured of an insulation material or a metal material, such as SiO2, SiOxNy, SixNy or the like, it is not limited thereto.

When the current blocking unit 70 is configured of a metal material, it may be configured of a metal material different from the metal material of the second electrode 32. When the current blocking unit 70 is configured of a metal material, direct injection of current into the second conductive semiconductor layer 18 can be suppressed through the current blocking unit 70 by disposing a material, of which the resistance between the second electrode 32 and the second conductive semiconductor layer 18 is higher than the resistance between the current blocking unit 70 and the second conductive semiconductor layer 18.

When the current blocking unit 70 is configured of a metal material, although the current blocking unit 70 may include at least one among ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (Antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au and Ni/IrOx/Au/ITO, it is not limited thereto.

The second electrode 32 may be configured of a material having a good electrical contact with the second conductive semiconductor layer 18. The second electrode 32 may be configured as a single layer or multiple layers. Although the second electrode 32 may include at least one among Ag, Ni, Cr, Ti, Al, Rh, Pd, Ir, Ru, Mg, Zn, Pt, Au, Hf, Be, Ge, ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (Antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au and Ni/IrOx/Au/ITO, it is not limited thereto.

The current blocking unit 70 and the first electrode 84 are vertically overlapped, and the horizontal width (e) of the current blocking unit may be one to five times of the horizontal width (a) of the first electrode.

When the horizontal width (e) of the current blocking unit is one or more times of the horizontal width (a) of the first electrode, a volume of the active layer 14, into which the current is injected, can be secured, and light speed of the semiconductor device can be enhanced. As the horizontal width (e) of the current blocking unit increases one or more times of the horizontal width (a) of the first electrode, light speed of the semiconductor device also increases in proportion thereto. However, the operation voltage of the semiconductor device may also increase proportionally as the light speed of the semiconductor device increases proportionally.

Since the operation voltage of the semiconductor device increases when the horizontal width (e) of the current blocking unit is five or more times of the horizontal width (a) of the first electrode, the horizontal width (e) of the current blocking unit may be less than five times of the horizontal width (a) of the first electrode to secure the electrical characteristic of the semiconductor device.

Accordingly, considering both the electrical characteristic and light speed, the horizontal width (e) of the current blocking unit may be one to five times of the horizontal width (a) of the first electrode.

As shown in FIG. 8, the current blocking unit 70 may include a plurality of recesses 75, and the plurality of recesses 75 may pass through the 2-3 conductive semiconductor layer 18c and expose part of the 2-2 conductive semiconductor layer 18b, and the second electrode 32 may be disposed inside the plurality of recesses 75.

The plurality of recesses 75 may be disposed to pass through the 2-3 conductive semiconductor layer 18c and expose as much as 0 to 50% of the thickness of the 2-2 conductive semiconductor layer 18b.

When the plurality of recesses 75 is disposed to pass through the 2-3 conductive semiconductor layer 18c and expose 0% or more than the thickness of the 2-2 conductive semiconductor layer 18b, the plurality of recesses 75 may pass through the 2-3 conductive semiconductor layer 18c and contact with the 2-2 conductive semiconductor layer 18b, and although the second electrode 32 is disposed inside the recesses 75, the plurality of recesses 75 may perform a current blocking function as an Ohmic contact is not formed at the portion contacting with the 2-2 conductive semiconductor layer 18b.

Since the operation voltage of the semiconductor device increases when the plurality of recesses 75 is disposed to pass through the 2-3 conductive semiconductor layer 18c and expose 50% or more than the thickness of the 2-2 conductive semiconductor layer 18b, the plurality of recesses 75 may be disposed to pass through the 2-3 conductive semiconductor layer 18c and expose less than 50% of the thickness of the 2-2 conductive semiconductor layer 18b to secure the electrical characteristic of the semiconductor device.

The horizontal width (e) of the recess may be one to five times of the horizontal width (a) of the first electrode.

As shown in FIG. 9, when the horizontal width (e) of the recess is one or more times of the horizontal width (a) of the first electrode, a wider light emitting area can be utilized, and light speed can be enhanced. Although the larger the horizontal width (e) of the recess than the horizontal width (a) of the first electrode, the higher the light speed of the semiconductor device may be in proportion thereto, the operation voltage of the semiconductor device may also increase proportionally as the light speed of the semiconductor device increases.

Since the operation voltage of the semiconductor device increases in proportion to the horizontal width (e) of the recess when the horizontal width (e) of the recess is five or more times of the horizontal width (a) of the first electrode, the horizontal width (e) of the recess may be less than five times of the horizontal width (a) of the first electrode to secure the electrical characteristic of the semiconductor device.

Accordingly, considering both the electrical characteristic and light speed of the semiconductor device, the horizontal width (e) of the recess may be one to five times of the horizontal width (a) of the first electrode.

Meanwhile, the semiconductor device and the semiconductor device package according to an embodiment described above may be arrayed on a substrate in plurality, and optical members, such as a light guide panel, a prism sheet, a diffusion sheet and the like, may be disposed on the optical path of the semiconductor device package.

In addition, a light source device including the semiconductor device package according to an embodiment may be implemented.

In addition, the light source device may include a light source module including a substrate and a semiconductor device package according to an embodiment, a heat sink for emitting heat of the light source module, and a power supply unit for processing or converting an electrical signal received from the outside and providing the signal to the light source module. For example, the light source device may include a lamp, a head lamp, a street lamp and the like. In addition, the light source device according to an embodiment may be diversely applied to the products which need outputted light.

In addition, the light source device may include a bottom cover; a reflecting plate disposed on the bottom cover; a light emitting module for emitting light, which includes a semiconductor device; a light guide panel disposed in front of the reflecting plate to lead forward the light emitted from light emitting module; an optical sheet including prism sheets disposed in front of the light guide panel; a display panel disposed in front of the optical sheet; a video signal output circuit connected to the display panel to supply a video signal to the display panel; and a color filter disposed in front of the display panel. Here, the bottom cover, the reflecting plate, the light emitting module, the light guide panel, and the optical sheet may configure a backlight unit.

As still another example of the light source device, a head lamp may include a light emitting module including a semiconductor device package disposed on a substrate; a reflector for reflecting the light radiated from the light emitting module to a predetermined direction, e.g., toward the front side; a lens for refracting forward the light reflected by the reflector; and a shade for blocking or reflecting part of the light reflected by the reflector toward the lens to form a light distribution pattern desired by a designer.

Meanwhile, FIG. 10 is an exploded perspective view showing a light source device according to an embodiment.

A lighting apparatus according to an embodiment may include a cover 2100, a light source module 2200, a heat sink 2400, a power supply unit 2600, an inner case 2700, and a socket 2800. In addition, the lighting apparatus according to an embodiment may include any one or more among a member 2300 and a holder 2500. The light source module 2200 may include a semiconductor device package according to an embodiment.

The light source module 2200 may include a light source unit 2210, a connecting plate 2230, and a connector 2250. The member 2300 is disposed on the top surface of the heat sink 2400 and has guide grooves 2310 in which a plurality of light source units 2210 and the connector 2250 are inserted.

The holder 2500 blocks an accommodation groove 2719 of an insulation unit 2710 of the inner case 2700. Accordingly, the power supply unit 2600 accommodated in the insulation unit 2710 of the inner case 2700 is tightly sealed. The holder 2500 has a guide projection unit 2510.

The power supply unit 2600 may include a projection unit 2610, a guide unit 2630, a base 2650, and an extension unit 2670. The inner case 2700 may include a molding unit inside thereof, together with the power supply unit 2600. The molding unit is a portion where molding liquid is hardened to fix the power supply unit 2600 inside the inner case 2700.

The features, structures and effects described above in the embodiments are included in at least one embodiment, and it is not necessarily limited to only one embodiment. Furthermore, the features, structures and effects exemplified in each embodiment may also be embodied to be combined or modified with respect to the other embodiments by those skilled in the art. Accordingly, it should be interpreted that the matters related to the combinations and modifications are included in the scope of the embodiments.

Although it has been described focusing on the embodiments, this is only illustrative, not restrictive, and it will be understood that those skilled in the art may make various modifications and applications not illustrated above without departing from the intrinsic features of the embodiments. For example, each constitutional element specifically shown in the embodiments may be modified. In addition, differences related to these modifications and applications should be interpreted to be included in the scope of the embodiments defined by the appended claims.

The invention claimed is:

1. A semiconductor device comprising:
   a conductive substrate;
   a semiconductor structure disposed on the conductive substrate and including a first conductive semiconductor layer, a second conductive semiconductor layer, and an active layer disposed between the first conductive semiconductor layer and the second conductive semiconductor layer; and
   a first electrode disposed on the semiconductor structure and electrically connected to the first conductive semiconductor layer, wherein
   the semiconductor structure further includes a 1-1 conductive semiconductor layer between the first conductive semiconductor layer and the first electrode, and a top surface of the semiconductor structure includes a flat part, on which the first electrode is disposed, and a concave-convex part surrounding the flat part, wherein
   a second distance from a bottom surface of the semiconductor structure to a bottom surface of the concave-convex part contacting with a side surface of the flat part is 70 to 95% of a first distance from the bottom surface of the semiconductor structure to a top surface of the 1-1 conductive semiconductor layer,
   wherein the second conductive semiconductor layer includes a 2-1 conductive semiconductor layer closest to the active layer, and a 2-2 conductive semiconductor layer disposed on a bottom of the 2-1 conductive semiconductor layer, and
   wherein the 2-2 conductive semiconductor layer includes a first area having a tilt angle the same as a tilt angle of a side surface of the active layer, and a second area having a width larger than a horizontal width of the first area.

2. The device according to claim 1, wherein a horizontal width of the 1-1 conductive semiconductor layer is the same as a horizontal width of the first electrode.

3. The device according to claim 1, wherein a width of the flat part is two to three times of a width of the top surface of the 1-1 conductive semiconductor layer.

4. The device according to claim 1, further comprising a pad electrode directly contacting the first conductive semiconductor layer.

5. The device according to claim 4, wherein a top surface of the first electrode surrounds a top surface of the pad electrode, and a stacking structure of the first electrode is different from a stacking structure of the pad electrode.

6. The device according to claim 4, wherein a top surface of the pad electrode is disposed in a circular shape.

7. The device according to claim 1,
wherein the 2-1 conductive semiconductor layer and the 2-2 conductive semiconductor layer are configured of different materials.

8. The device according to claim 1, wherein the 2-2 conductive semiconductor layer includes a first dopant and a second dopant,
wherein the second conductive semiconductor layer further includes a 2-3 conductive semiconductor layer disposed on a bottom of the 2-2 conductive semiconductor layer and including the first dopant and the second dopant, and
wherein a concentration of the first dopant included in the 2-2 conductive semiconductor layer and a concentration of the first dopant included in the 2-3 conductive semiconductor layer are different from each other, and a concentration of the second dopant included in the 2-2 conductive semiconductor layer and a concentration of the second dopant included in the 2-3 conductive semiconductor layer are different from each other.

9. The device according to claim 8,
wherein a ratio of a thickness of the first area to a thickness of the second area is 1:1 to 2:3.

10. A semiconductor device comprising:
a conductive substrate;
a semiconductor structure disposed on the conductive substrate and including a first conductive semiconductor layer, a second conductive semiconductor layer, and an active layer disposed between the first conductive semiconductor layer and the second conductive semiconductor layer;
a first electrode electrically connected to the first conductive semiconductor layer;
a second electrode electrically connected to the second conductive semiconductor layer; and
a current blocking unit disposed between the second conductive semiconductor layer and the second electrode, wherein
the current blocking unit include a plurality of recesses, wherein
the first electrode and the current blocking unit are vertically overlapped, and a horizontal width of the current blocking unit is one to five times of a horizontal width of the first electrode,
wherein the second conductive semiconductor layer includes a 2-1 conductive semiconductor layer closest to the active layer, a 2-2 conductive semiconductor layer disposed on a bottom of the 2-1 conductive semiconductor layer, and a 2-3 conductive semiconductor layer disposed on a bottom of the 2-2 conductive semiconductor layer, and
wherein the plurality of recesses pass through the 2-3 conductive semiconductor layer and expose a portion of the 2-2 conductive semiconductor layer.

11. The device according to claim 10, wherein a material of the second electrode is different than a material of the current blocking unit.

12. The device according to claim 11, wherein the material of the second electrode includes a first metal material, and the material of the current blocking unit includes a second metal material different than the first metal material.

13. The device according to claim 10, wherein a material of the current blocking unit includes an insulation material different than a metal material of the second electrode.

14. The device according to claim 10, wherein the second electrode is disposed inside the plurality of recesses.

15. The device according to claim 10, wherein the 2-2 conductive semiconductor layer includes a first area having a tilt angle the same as a tilt angle of a side surface of the active layer, and a second area having a width larger than a horizontal width of the first area.

16. The device according to claim 15, wherein a ratio of a thickness of the first area to a thickness of the second area is 1:1 to 2:3.

17. The device according to claim 10, wherein the 2-2 conductive semiconductor layer includes a first dopant and a second dopant, and the 2-3 conductive semiconductor layer includes the first dopant and the second dopant, and
wherein a concentration of the first dopant included in the 2-2 conductive semiconductor layer and a concentration of the first dopant included in the 2-3 conductive semiconductor layer are different from each other, and a concentration of the second dopant included in the 2-2 conductive semiconductor layer and a concentration of the second dopant included in the 2-3 conductive semiconductor layer are different from each other.

18. The device according to claim 10, wherein a horizontal width of the 1-1 conductive semiconductor layer is the same as a horizontal width of the first electrode.

19. The device according to claim 10, wherein a top surface of the 1-1 conductive semiconductor structure includes a flat part, on which the first electrode is disposed, and a concave-convex part surrounding the flat part, and
wherein a width of the flat part is two to three times of a width of a top surface of the 1-1 conductive semiconductor layer.

20. The device according to claim 10, further comprising a pad electrode directly contacting the first conductive semiconductor layer,
wherein a top surface of the first electrode surrounds a top surface of the pad electrode, and a stacking structure of the first electrode is different from a stacking structure of the pad electrode, and
wherein the top surface of the pad electrode is disposed in a circular shape.

* * * * *